(12) United States Patent
Olleres et al.

(10) Patent No.: US 9,397,053 B2
(45) Date of Patent: Jul. 19, 2016

(54) MOLDED DEVICE WITH ANTI-DELAMINATION STRUCTURE PROVIDING MULTI-LAYERED COMPRESSION FORCES

(71) Applicant: Hong Kong Applied Science and Technology Research Institute Company Limited, Hong Kong (HK)

(72) Inventors: Lourdito Olleres, Hong Kong (HK); Yueping Ye, Hong Kong (HK); Man Kai Cheung, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 63 days.

(21) Appl. No.: 14/514,396

(22) Filed: Oct. 15, 2014

(65) Prior Publication Data

US 2016/0111377 A1     Apr. 21, 2016

(51) Int. Cl.
*H01L 23/053* (2006.01)
*H01L 23/00* (2006.01)
*H01L 23/498* (2006.01)
*H01L 23/31* (2006.01)

(52) U.S. Cl.
CPC .......... *H01L 23/562* (2013.01); *H01L 23/3142* (2013.01); *H01L 23/49822* (2013.01); *H01L 23/49833* (2013.01); *H01L 23/49838* (2013.01); *H01L 23/49866* (2013.01); *H01L 23/3121* (2013.01); *H01L 2224/16225* (2013.01); *H01L 2224/45124* (2013.01); *H01L 2224/73253* (2013.01); *H01L 2224/83447* (2013.01); *H01L 2224/85447* (2013.01)

(58) Field of Classification Search
CPC . H01L 23/562; H01L 23/053; H01L 23/3107; H01L 23/49822; H01L 23/49833; H01L 23/49838; H01L 23/49866
See application file for complete search history.

(56) References Cited

U.S. PATENT DOCUMENTS

| 5,465,898 | A | 11/1995 | Schulz-Harder et al. |
| 6,190,834 | B1 * | 2/2001 | Narahara .............. C08F 290/14 430/280.1 |
| 6,703,707 | B1 * | 3/2004 | Mamitsu ............... H01L 23/051 257/713 |
| 6,715,203 | B2 | 4/2004 | Stolze et al. |

* cited by examiner

*Primary Examiner* — Whitney T Moore
*Assistant Examiner* — Joseph Galvin, III
(74) *Attorney, Agent, or Firm* — Ella Cheong Hong Kong; Sam T. Yip

(57) ABSTRACT

The present invention provides a molded encapsulated multi-layered semiconductor device, comprising a first substrate, a second substrate and an anti-delamination structure (ADS). The ADS comprises a connecting part and extended structures, and is filled by an insulating material. The present invention is able to provide the molded semiconductor device with higher reliability and longer lifetime through reduction of shear stress generated from the coefficient of thermal expansion mismatch between a silicon die and the substrates by mechanically locking with the ADS.

20 Claims, 8 Drawing Sheets

(B) With ADS

ADS
Stress is concentrated on the ADS and away from the corner of the EMC/substrate.

Delamination of DBC substrate after ~100 temperature cycles

A. Without ADS

B. With ADS (holes on the ceramic and copper have different diameters)

C. With ADS (holes on the ceramic and copper have same diameter)

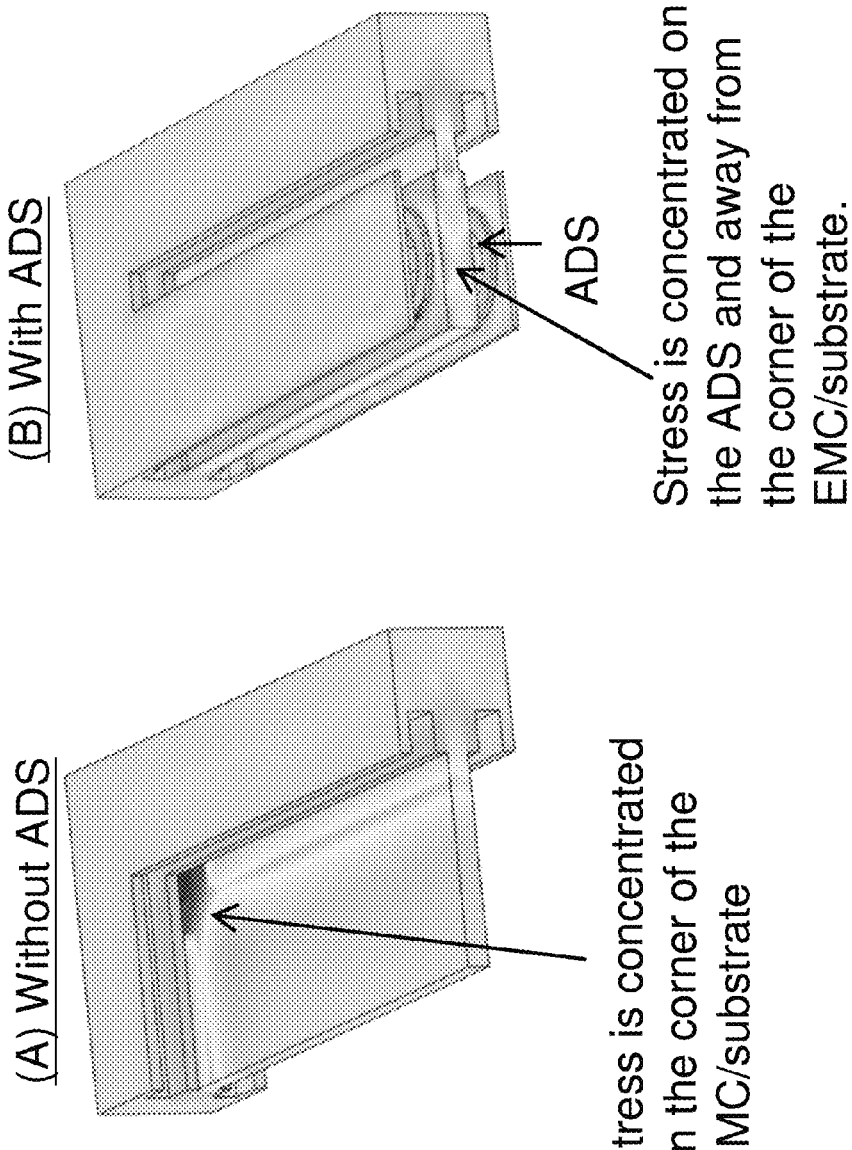

MOLDED DEVICE WITH ANTI-DELAMINATION STRUCTURE PROVIDING MULTI-LAYERED COMPRESSION FORCES

FIELD OF THE INVENTION

The present invention relates to a semiconductor device, and particularly relates to a molded encapsulated multi-layered semiconductor device.

BACKGROUND

In recent years, power semiconductors have been widely used in automobile electronics, power management and automation technology. Those power semiconductors are generally combined to form modules which are tailored to fit customer-specific requirements.

In such power semiconductor modules, individual electronic components are generally mounted on a substrate. The substrate is usually produced in the form of a sandwich, with a ceramic plate sandwiched between two outer metal plates. Those metal plates are generally made of copper, since copper has very good properties in terms of electrical conductivity and thermal conductivity. The substrate having the copper/ceramic/copper sandwich structure is referred to as a direct bonded copper (DBC) substrate. The DBC substrate has two layers of copper bonded onto a ceramic base, carrying high currents and providing high voltage isolation.

High power IGBT module is commonly used in the industry. The module is expected to provide ultra high power up to Mega Watt (MW), long service life up to 15 years, and operating temperature up to 200° C. Ceramic based direct bonded copper is frequently used as a dielectric carrier, and the corresponding sealing comprises silicone and plastic housing. FIG. 1 is a schematic diagram showing a conventional IGBT module according to a prior art. Comparing with microelectronics, power electronics have to meet a series of harsh requirements such as long power cycling, vibration test with high impacts, and long lifetime. Thus, there are lots of inventions relating to this area.

U.S. Pat. No. 6,715,203 provides a substrate for power semiconductor modules with a through-plating of solder, including two metal plates and a ceramic plate which is seated as a layer between the metal plates and has a through hole formed therein. The substrate is plated through by making a through hole in one of the metal plates in alignment with the through hole in the ceramic plate and applying a paste solder to one side of the substrate. The substrate is then subjected to a furnace step, so that the paste solder flows into the through holes and the solder makes a permanent contact between the two metal plates. Nevertheless, the through hole with solder provides electric connection of both surfaces of the ceramic layer.

U.S. Pat. No. 6,703,707 provides a semiconductor device including two semiconductor chips that are interposed between a pair of radiation members, and thermally and electrically connected to the radiation members. One of the radiation members has two protruding portions and front ends of the protruding portions are connected to principal electrodes of the semiconductor chips. The radiation members are made of a metallic material containing Cu or Al as a main component. The semiconductor chips and the radiation members are sealed with resin with externally exposed radiation surfaces. However, the chips interposed between the two metal blocks provide no voltage isolation.

U.S. Pat. No. 5,465,898 discloses a process provided where a ceramic metal substrate is produced by attaching metal foils on either side a ceramic layer to form metal layers and for producing a through connection by placing metal in an opening to form a bridge so that the metal layers are electrically connected together by direct bonding, and a metal body is inserted into the opening to almost fill it, while a surface of the metal body is provided with a layer with chemical compound of metal and reactive gas. However, the metal bridge makes electric connection of both surfaces of ceramic layer.

Nevertheless, insufficient module protection may lead to fail in stringent reliability tests. FIG. 2 is a photo showing a directed bonded copper substrate failed after about 100 temperature cycles according to a prior art. The copper layer is peeled off from the ceramic layer, and such failure is come from the coefficient of thermal expansion (CTE) mismatch between the core ceramic and the bonded copper.

Consequently, there is an unmet need for a power electronics module that provides high reliability and long lifetime.

SUMMARY OF THE INVENTION

Accordingly, the presently claimed invention is to provide a molded encapsulated multi-layered semiconductor device.

In accordance with an embodiment of the presently claimed invention, a molded encapsulated multi-layered semiconductor device comprises: a first substrate comprising at least one first composite layer and at least one first through hole; a second substrate comprising at least one second composite layer and at least one second through hole; and at least one anti-delamination structure (ADS), made of an insulating material molded at least one side of the semiconductor device and filled between the first substrate and the second substrate.

The ADS further comprises a connecting part, a first extended structure and a second extended structure, and the first extended structure and the second extended structure are located on both sides of the connecting part respectively, and have larger cross sectional area than that of the connecting part; wherein the connecting part passes through the first through hole and the second through hole for providing a compression force to prevent delamination of the multi-layered semiconductor device. Preferably, the first extended structure extends horizontally on an outer surface of the first substrate, and the second extended structure extends horizontally on an outer surface of the second substrate for providing a compression force to prevent delamination of the multi-layered semiconductor device.

Preferably, a cross sectional area of the first through hole is different from that of the second through hole.

Preferably, a cross sectional area of the first through hole is same as that of the second through hole.

Preferably, the first though hole has different cross sectional areas in different first composite layers, and/or the second though hole has different cross sectional areas in different second composite layers for optimizing internal stress distribution to reduce the intensity of the stress concentration.

Preferably, the first though hole has same cross sectional area in different first composite layers, and/or the second though hole has same cross sectional area in different second composite layers.

Preferably, the first composite layers and/or the second composite layers comprise a ceramic layer and at least one metal layer. The first through hole and/or the second through hole has a cross sectional area in the ceramic layer smaller than that in the metal layer. The first through hole and/or the second through hole in the metal layer comprises a shape of step.

Preferably, the insulating material is an epoxy molding compound molded by one molding action.

The present invention is able to provide a molded encapsulated multi-layered semiconductor device with higher reliability and longer lifetime through reduction of shear stress generated from the coefficient of thermal expansion mismatch between a silicon die and substrates by mechanically locking with the ADS. Furthermore, the weight and size of the semiconductor device can be further reduced.

BRIEF DESCRIPTION OF THE DRAWINGS

Embodiments of the present invention are described in more detail hereinafter with reference to the drawings, in which:

FIG. 8A shows shear stress simulation results for a molded encapsulated multi-layered semiconductor device without ADS according to an embodiment of the presently claimed invention; and FIG. 8B shows shear stress simulation results for a molded encapsulated multi-layered semiconductor device with ADS according to an embodiment of the presently claimed invention.

DETAILED DESCRIPTION OF PREFERRED EMBODIMENTS

In the following description, molded encapsulated multi-layered semiconductor devices are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Figure 1:
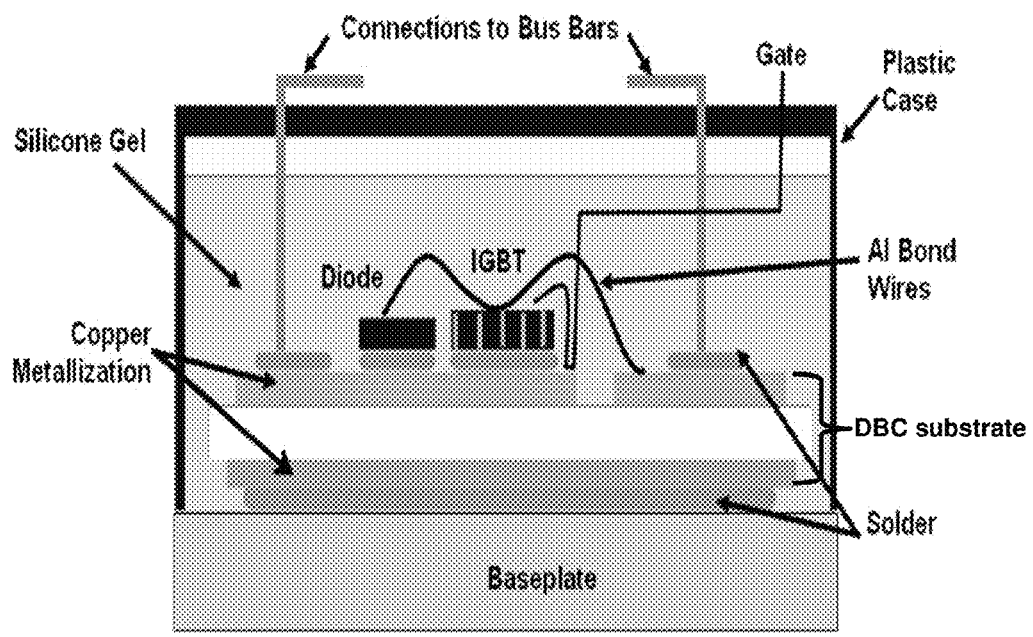
FIG. 1 is a schematic diagram showing a conventional IGBT module according to a prior art.
Figure 2:
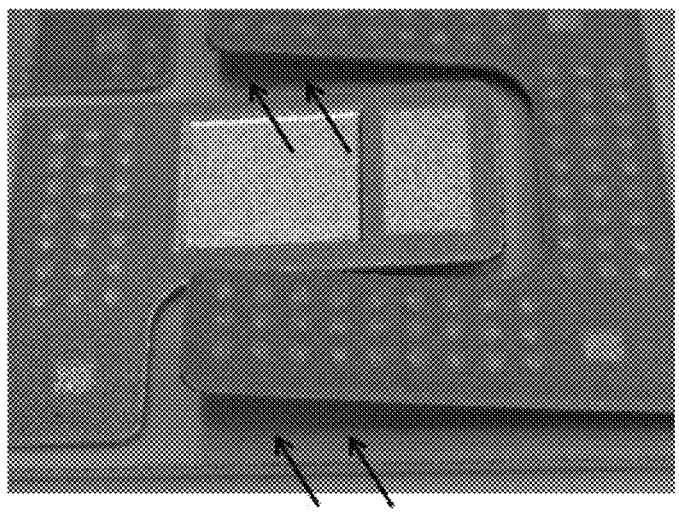
FIG. 2 is a photo showing a directed bonded copper (DBC) substrate failed after about 100 temperature cycle according to a prior art.
Figure 3A:
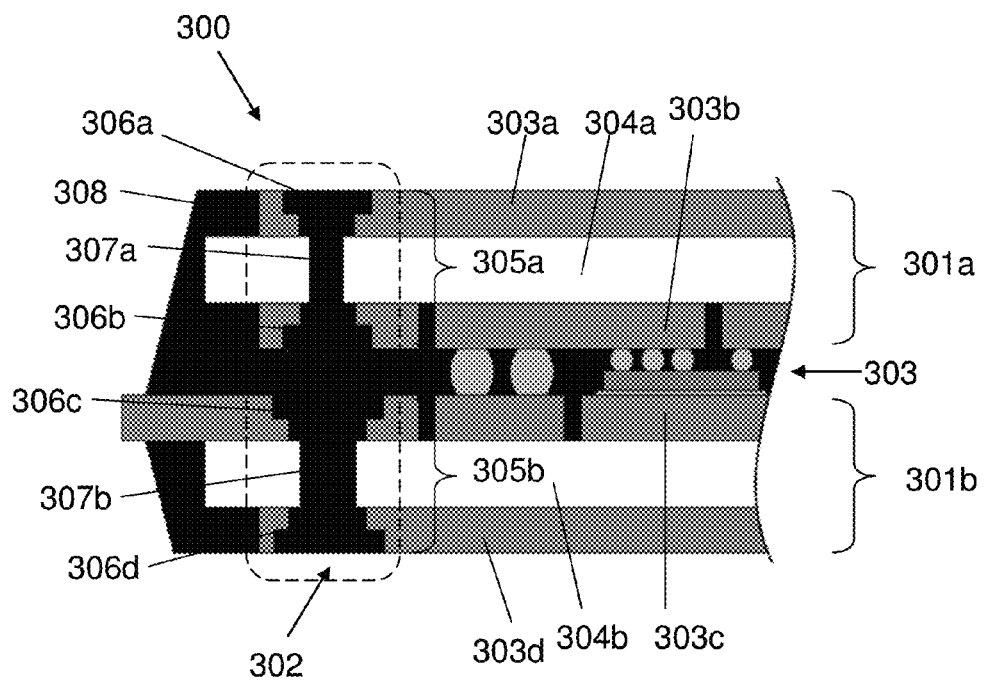
FIG. 3A is a schematic diagram showing a molded encapsulated multi-layered semiconductor device without over mold according to an embodiment of the presently claimed invention.

FIG. 3A is a schematic diagram showing a molded encapsulated multi-layered semiconductor device according to an embodiment of the presently claimed invention. The fully molded device 300 comprises a first DBC substrate 301a, a second DBC substrate 301b, an anti delamination structure (ADS) 302, and electronic components 303.

The first DBC substrate 301a comprises an upper first copper layer 303a, a first ceramic layer 304a, and a lower first copper layer 303b. The first DBC substrate 301a further comprises a first through hole 305a, formed by an upper first copper hole 306a in the upper first copper layer 303a, a first ceramic hole 307a in the first ceramic layer 304a, and a lower first copper hole 306b in the lower first copper layer 303b. The diameter of the upper first copper hole 306a is larger than that of the first ceramic hole 307a, and the diameter of lower first copper hole 306b is larger than that of the first ceramic hole 307a. The upper first copper hole 306a and the lower first copper hole 306b are in a shape of step for optimizing internal stress distribution to reduce the intensity of the stress concentration.

Similarly, the second DBC substrate 301b comprises an upper second copper layer 303c, a second ceramic layer 304b, and a lower second copper layer 303d. The second DBC substrate 301b further comprises a second through hole 305b, formed by an upper second copper hole 306c in the upper second copper layer 303c, a second ceramic hole 307b in the second ceramic layer 304b, and a lower second copper hole 306d in the lower second copper layer 303d. The diameter of the upper second copper hole 306c is larger than that of the second ceramic hole 307b, and the diameter of lower second copper hole 306d is also larger than that of the second ceramic hole 307b. The upper second copper hole 306c and the lower second copper hole 306d are also in a shape of step for optimizing internal stress distribution to reduce the intensity of the stress concentration.

The ADS 302 comprises epoxy molding compound (EMC) filled between the first DBC substrate 301a and the second DBC substrate 301b, within the first through hole 305a, and within the second through hole 305b. The ADS 302 comprises a connecting part, which passes through the first through hole 305a of the first DBC substrate 301a, and the second through hole 305b of the second DBC substrate 301b. The two ends of the ADS 302, connected with the connecting part, extend horizontally on the outer surfaces of the first DBC substrate 301a and second DBC substrates 301b to form an upper extended structure and a lower extended structure respectively. The compression forces are provided by the ADS 302 simultaneously to prevent de-lamination of the multi-layered semiconductor device 300.

The EMC protects the electronic components 303 such as interconnect structure and silicon die. It redistributes the thermo-mechanical stress generated from the coefficient of thermal expansion (CTE) mismatch between the silicon die and the substrates by mechanically locking these dissimilar materials together resulting to the reduction of in-plane movement.

Figure 3B:
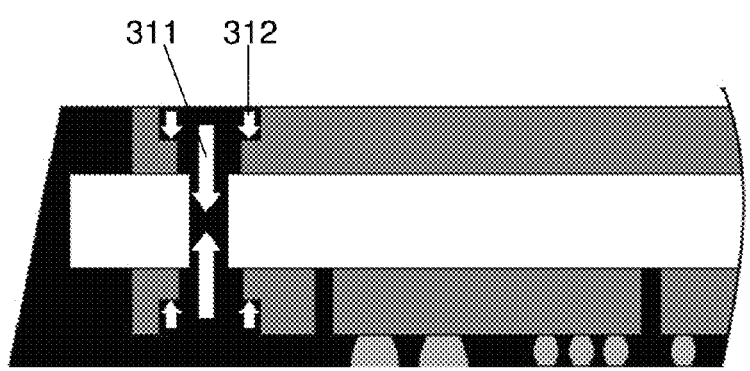
FIG. 3B is a magnified view showing the first DBC substrate of the device of FIG. 3A.

FIG. 3B is a magnified view showing the first DBC substrate of the device of FIG. 3A. FIG. 3B shows forces acting on the first DBC substrate 301a. The big arrows represent shrinkage forces 311 inside EMC itself, and the smaller arrows represent compression forces 312 acting on the multilayered first DBC substrate 301a induced by the shrinkage force 311 of EMC. The EMC of the ADS 302 creates shrinkage forces 311 due to the shrinkage of EMC during curing. The compression forces 312 are acting on all the individual substrate preventing the de-lamination of copper-to-ceramic interface and EMC-to-copper interface.

Accordingly, the diameters of the through hole at different composite layers of the DBC substrate are different such that the internal stress distribution in the multi-layered device is optimized by the increased horizontal surface area of the through hole.

Accordingly, the diameter of the through hole at the copper layer is larger than that at the ceramic layer to increase horizontal surface area in the ADS. The diameter of the through hole at bottom substrate is larger than that at the top substrate such that the compression force applied to the multi-layered semiconductor device is strengthened by an increased volume of the insulating material on the through hole at the bottom substrate.

FIG. 4A-D are schematic diagrams showing four molded encapsulated multi-layered semiconductor device without over mold according to a first, a second, a third, and a fourth embodiments of the presently claimed invention respectively. The device without over mold means that a mold body does not exceed the horizontal surfaces of the first and second DBC substrates.

Figure 4A:
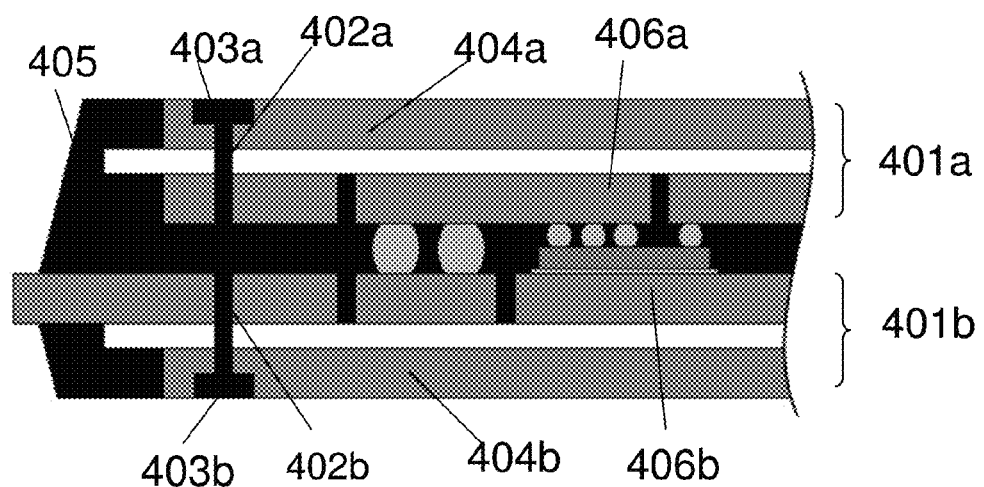
FIG. 4A-D are schematic diagrams showing four molded encapsulated multi-layered semiconductor devices without over mold according to a first, a second, a third and a fourth embodiments of the presently claimed invention.

In the embodiment as shown in FIG. 4A, a first through hole 402a of a first DBC substrate 401a is same as a second through hole 402b of a second DBC substrate 401b. Both of the first through hole 402a and the second through hole 402b are straight through holes. The upper and lower extended structures 403a and 403b are extended horizontally within an upper first copper layer 404a and a lower second copper layer 404b respectively. Such configuration can reduce the step of etching out the copper on a lower first copper layer 406a and an upper second copper layer 406b, thereby simplifying the manufacturing process.

Figure 4B:
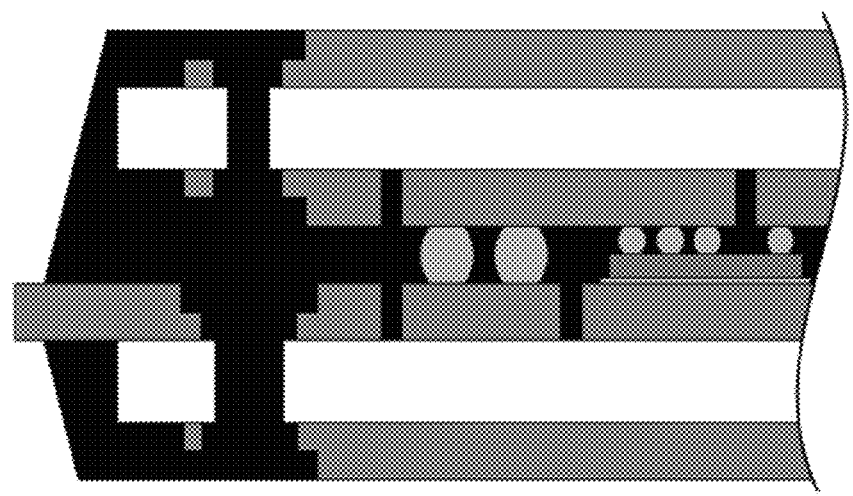

The embodiment of FIG. 4B is similar to the embodiment of FIG. 4A but the first DBC substrate 401a and the second DBC substrate 401b are half etched at the ends of the first through hole 402a and the second through hole 402b respectively for an EMC to fill in. Both upper and lower extended structures 403a and 403b of the ADS are further enlarged to connect with a mold body 405 that can increase the contact surface area between the ends of the ADS and the substrate surface. The first through hole 402a in lower first copper layer 406a and the second through hole 402b in upper second copper layer 406b are etched in a shape of step.

Figure 4C:
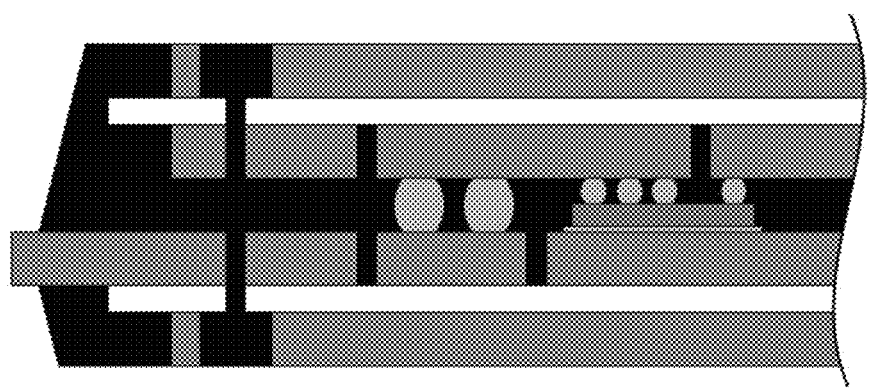

The embodiment of FIG. 4C is similar to the embodiment of FIG. 4A but two straight through holes are formed on the upper first copper layer 404a and the lower second copper layer 404b respectively, and the upper and lower extended structures 403a and 403b are extended horizontally and completely within the upper first copper layer 404a and the lower second copper layer 404b respectively. Such configuration can reduce the complexity for etching out the copper on the upper first copper layer 404a and the lower second copper layer 404b, thereby simplifying the manufacturing process.

Figure 4D:
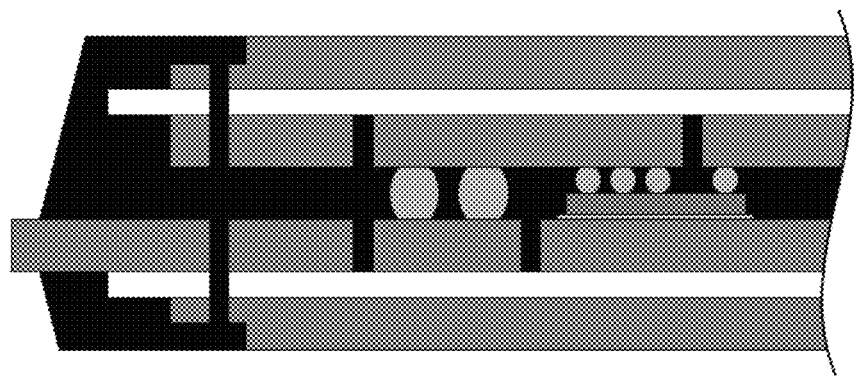

The embodiment of FIG. 4D is similar to the embodiment of FIG. 4A but the first DBC substrate 401a and the second DBC substrate 401b are half etched at the ends of the first through hole 402a in the upper first copper layer 404a and the second through hole 402b in the lower second copper layer 404b in a shape of step respectively for the EMC to fill in. Both upper and lower extended structures 403a and 403b of the ADS are further enlarged to connect with the mold body 405 that can increase the contact surface area between the ends of the ADS and the substrate surface.

Figure 5A:
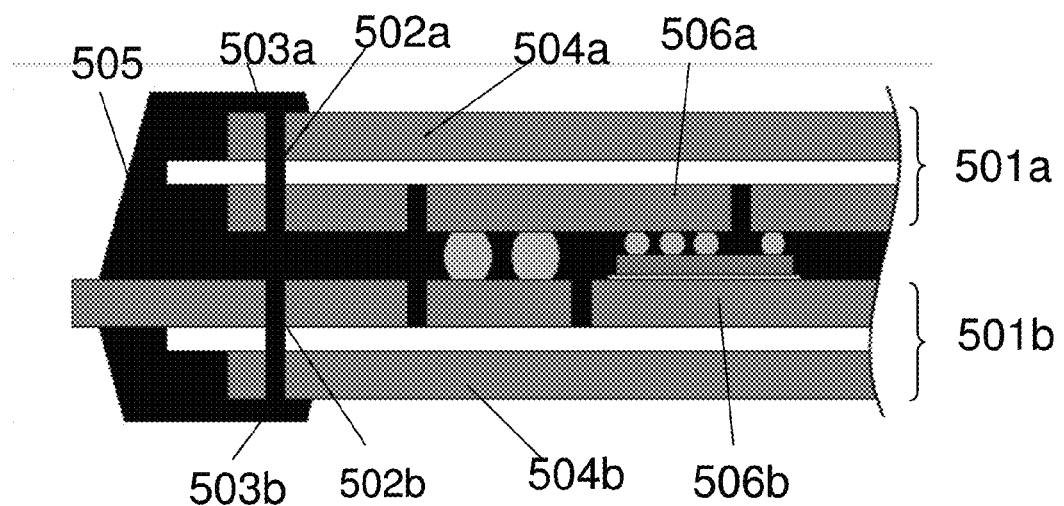
FIG. 5A-B are schematic diagrams showing two molded encapsulated multi-layered semiconductor devices with over mold according to a first and a second embodiments of the presently claimed invention.
Figure 5B:
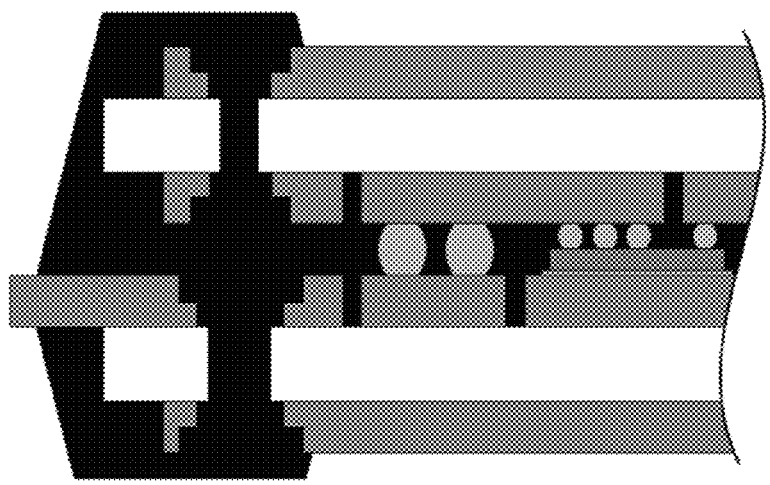

FIG. 5A-B are schematic diagrams showing two molded encapsulated multi-layered semiconductor devices with over mold according to a first and a second embodiments of the presently claimed invention. The device with over mold means that part of the mold body exceeds a portion of the horizontal surfaces of the first and the second DBC substrates.

In the embodiment of FIG. 5A, a first through hole 502a of the first DBC substrate 501a is a straight through hole, and same as the second through hole 502b of the second DBC substrate 501b, and both of the ends of the ADS extends horizontally over the surface of the first and the second DBC substrates 501a and 501b such that an upper and a lower extending structures 503a and 503b are connected with a mold body 505. Such configuration can reduce the step of etching both of the first and the second through holes, thereby simplifying the manufacturing process while still keeping high compression force due to the horizontal extension of the ends of the ADS.

The embodiment of FIG. 5B is similar to the embodiment of FIG. 5A but the first through hole 502a is smaller than the second through hole 502b. Furthermore, the first through hole 502a in an upper first copper layer 504a and a lower first copper layer 506a is in step shape. Similarly, the second through hole 502b in an upper second copper layer 506b and a lower second copper layer 504b is in step shape, which further optimize the internal stress distribution of the ADS and reduce the intensity of the stress concentration.

Figure 6:
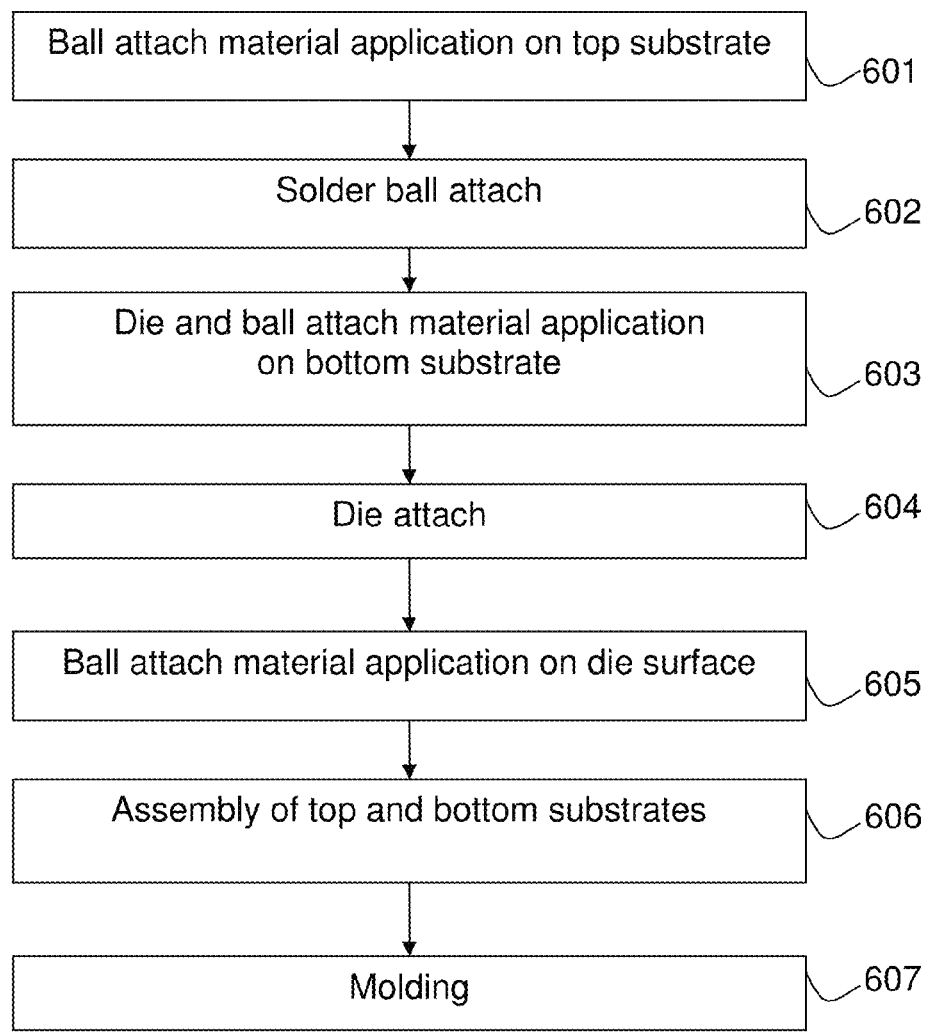
FIG. 6 is a flow chart showing the steps of a method for fabricating a molded encapsulated multi-layered semiconductor device according to an embodiment of the presently claimed invention.

FIG. 6 is a flow chart showing the steps of a method for fabricating a molded encapsulated multi-layered semiconductor device according to an embodiment of the presently claimed invention. In step 601, ball attach materials applied on a top substrate. In step 602, solder balls are attached on the top substrate. In step 603, die and ball attach materials are applied on a bottom substrate. In step 604, a die is attached on the bottom substrate. In step 605, ball attach materials are applied on the die surface. In step 606, the top substrate and the bottom substrate are assembled together. In step 607, the assembly of the top substrate and the bottom substrate are molded to form the molded encapsulated multi-layered semiconductor device.

Figure 7A:
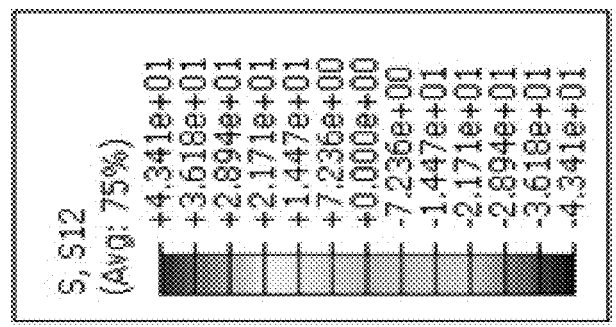
FIG. 7A shows shear stress simulation results for a molded encapsulated multi-layered semiconductor device without ADS according to an embodiment of the presently claimed invention.
Figure 7A:
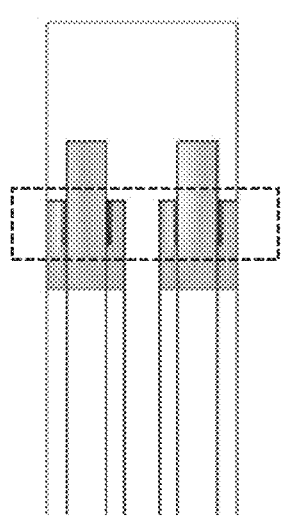
Figure 7B:
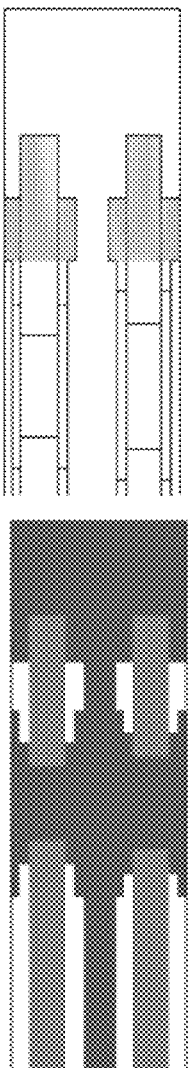
FIG. 7B shows shear stress simulation results for a molded encapsulated multi-layered semiconductor device with ADS having holes on the ceramic and copper layers with different diameters according to an embodiment of the presently claimed invention.
Figure 7C:
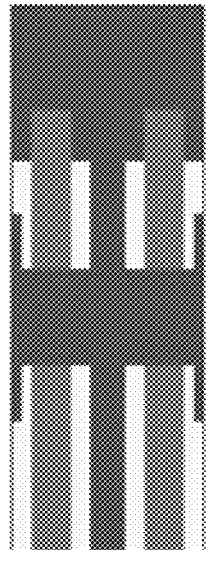
FIG. 7C shows shear stress simulation results for a molded encapsulated multi-layered semiconductor device with ADS having holes on the ceramic and copper layers with a same diameter according to an embodiment of the presently claimed invention.

FIG. 7A-C shows shear stress simulation results for three molded encapsulated multi-layered semiconductor devices without ADS, with ADS having holes on the ceramic and copper layers with different diameters, and with ADS having holes on the ceramic and copper layers with a same diameter respectively according to an embodiment of the presently claimed invention. In the shear stress simulation result, darker in color represents higher shear stress. As shown in FIG. 7A, for the device without ADS, high shear stress is found at the boundaries between the ceramic and the copper layers. As shown in FIG. 7B, for the device with ADS having holes on the ceramic and copper layers with different diameters, only slight shear stress is found at the boundaries between the ceramic and the copper layers. As shown in FIG. 7C, the device with ADS having holes on the ceramic and copper layers with same diameter has higher shear stress at the boundaries between the ceramic and copper layers than that with different diameters but much lower than that without ADS.

The numerical results of the simulations are shown in Table 1.

TABLE 1

|  | Without ADS | With ADS (different diameters) | With ADS (same diameter) |
|---|---|---|---|
| Max shear stress (MPa) | 43.4 | 21.8 | 30.2 |
| Stress reduced |  | 49.8% | 30.4% |

Comparing with the device without ADS, the devices with ADS having holes on the ceramic and copper layers with different diameters and same diameter achieve stress reduction up to 49.8% and 30.4% respectively.

FIG. 8A-B shows shear stress simulation results for two molded encapsulated multi-layered semiconductor devices without ADS, and with ADS respectively according to an embodiment of the presently claimed invention. As shown in FIG. 8A, for the device without ADS, high stress is concentrated on the corner and the boundaries of EMC/substrate. As shown in FIG. 8B, for the device with ADS, stress is concentrated on the ADS and relocated to far away from the corner of the EMC/substrate, and the maximum shear stress is highly reduced by the ADS.

Comparing with a conventional IGBT module, Infineon, 1200V/80 A, BSM50GP120, the molded module of the present invention is lighter and smaller in size as shown in Table 2.

TABLE 2

|  | Weight | Dimensions |
|---|---|---|
| Infineon 1200 V/80 A, BSM50GP120 | 300 g (Cu baseplate: >200 g) | 62 × 122 × 17 mm |
| Present invention | 65.5 g | 62 × 122 × 3.3 mm |
| Comparison | 78% reduction | 80% reduction |

Conventionally, copper baseplate is frequently used for heat release and thermal management but it is also considered as a heavy and clumsy component. Since two DBC substrates are used in the present invention, the conventionally used copper baseplate can be avoided, leading to substantial weight reduction (78%) and size reduction (80%) while providing even better reliability under temperature cycles.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A molded encapsulated multi-layered semiconductor device comprising:
    a first substrate comprising at least one first composite layer and at least one first through hole;
    a second substrate comprising at least one second composite layer and at least one second through hole; and
    at least one anti-delamination structure (ADS), made of an insulating material filled in between the first substrate and the second substrate;
    wherein the ADS comprises a connecting part passing through the first through hole and the second through hole, a first extended structure and a second extended structure, and the connecting part, the first extended structure, and the second extended structure are filled with the insulating material; and
    wherein the first extended structure and the second extended structure are located on both sides of the connecting part respectively, and have larger cross sectional area than that of the connecting part, providing a compression force to prevent delamination of the multi-layered semiconductor device.

2. The molded encapsulated multi-layered semiconductor device of claim 1, wherein the first extended structure extends horizontally on an outer surface of the first substrate, and the second extended structure extends horizontally on an outer surface of the second substrate.

3. The molded encapsulated multi-layered semiconductor device of claim 1, wherein a cross sectional area of the first through hole is same as that of the second through hole.

4. The molded encapsulated multi-layered semiconductor device of claim 1, wherein the first though hole has different cross sectional areas in different first composite layers, and/or the second though hole has different cross sectional areas in different second composite layers for optimizing internal stress distribution to reduce intensity of stress concentration.

5. The molded encapsulated multi-layered semiconductor device of claim 1, wherein the first though hole has same cross sectional area in different first composite layers, and/or the second though hole has same cross sectional area in different second composite layers.

6. The molded encapsulated multi-layered semiconductor device of claim 1, wherein the first composite layers and/or the second composite layers comprise a ceramic layer and at least one metal layer.

7. The molded encapsulated multi-layered semiconductor device of claim 6, wherein the first through hole and/or the second through hole has a cross sectional area in the ceramic layer smaller than that in the metal layer.

8. The molded encapsulated multi-layered semiconductor device of claim 6, wherein the first through hole and/or the second through hole in the metal layer comprises a shape of step.

9. The molded encapsulated multi-layered semiconductor device of claim 1, wherein the first substrate and/or the second substrate is a direct bonded copper (DBC) substrate comprising a ceramic layer sandwiched by two copper layers.

10. The molded encapsulated multi-layered semiconductor device of claim 1, wherein the insulating material is an epoxy molding compound, molded at one side of the semiconductor device.

11. The molded encapsulated multi-layered semiconductor device of claim 1, wherein the insulating material is molded by one molding action.

12. The molded encapsulated multi-layered semiconductor device of claim 1, wherein at least one electronic component is embedded between the first substrate and the second substrate.

13. The molded encapsulated multi-layered semiconductor device of claim 1, further comprising a mold body located at a lateral side of the first substrate and the second substrate.

14. The molded encapsulated multi-layered semiconductor device of claim 13, wherein the first extended structure and/or the second extended structure is connected with the mold body on an outer surface of the first substrate and/or the second substrate.

15. The molded encapsulated multi-layered semiconductor device of claim 1, wherein the first substrate and the second substrate is half-etched at one end of the first through hole and the second through hole for the insulating material to fill in.

16. The molded encapsulated multi-layered semiconductor device of claim 1, wherein diameters of the first through hole at different composite layers of the first substrate are larger than that of the second substrate such that the compression force applied to the multi-layered semiconductor device is strengthened by an increased volume of the insulating material on the first through hole.

17. A high power electronic module, comprising the molded encapsulated multi-layered semiconductor device of claim 1.

18. A high power electronic module, comprising the molded encapsulated multi-layered semiconductor device of claim 2.

19. A molded encapsulated multi-layered semiconductor device comprising:
- a first substrate comprising at least one first composite layer and at least one first through hole;
- a second substrate comprising at least one second composite layer and at least one second through hole; and
- at least one anti-delamination structure (ADS), made of an insulating material filled in between the first substrate and the second substrate;
- wherein the ADS comprises a connecting part passing through the first through hole and the second through hole, a first extended structure and a second extended structure;
- wherein the first extended structure and the second extended structure are located on both sides of the connecting part respectively, and have larger cross sectional area than that of the connecting part, providing a compression force to prevent delamination of the multi-layered semiconductor device; and
- wherein a cross sectional area of the first through hole is different from that of the second through hole.

20. A molded encapsulated multi-layered semiconductor device comprising:
- a first substrate comprising at least one first composite layer and at least one first through hole;
- a second substrate comprising at least one second composite layer and at least one second through hole; and
- at least one anti-delamination structure (ADS), made of an insulating material filled in between the first substrate and the second substrate;
- wherein the ADS comprises a connecting part passing through the first through hole and the second through hole, a first extended structure and a second extended structure;
- wherein the first extended structure and the second extended structure are located on both sides of the connecting part respectively, and have larger cross sectional area than that of the connecting part, providing a compression force to prevent delamination of the multi-layered semiconductor device; and
- wherein the insulating material filled between the first substrate and the second substrate protects an interconnect structure and a die attached on the first substrate or the second substrate, and redistributes thermo-mechanical stress generated from coefficient thermal expansion mismatch between the die and the first substrate or the second substrate.

* * * * *